United States Patent [19]

Gahle

[11] 4,440,580
[45] Apr. 3, 1984

[54] METHOD OF FABRICATING AN INTEGRATED BIPOLAR PLANAR TRANSISTOR BY IMPLANTING BASE AND EMITTER REGIONS THROUGH THE SAME INSULATING LAYER

[75] Inventor: Hans-Juergen Gahle, Emmendingen, Fed. Rep. of Germany

[73] Assignee: ITT Industries, Inc., New York, N.Y.

[21] Appl. No.: 364,156

[22] Filed: Mar. 31, 1982

[30] Foreign Application Priority Data

Apr. 14, 1981 [DE] Fed. Rep. of Germany ....... 3115029

[51] Int. Cl.³ ................. H01L 21/265; H01L 21/223; H01L 21/72
[52] U.S. Cl. .................................... 148/1.5; 29/576 B; 148/187; 357/34; 357/91
[58] Field of Search ............... 148/1.5, 187; 29/576 B; 357/91, 34

[56] References Cited

U.S. PATENT DOCUMENTS

| | | | |
|---|---|---|---|
| 3,920,483 | 11/1975 | Johnson | 148/1.5 |
| 3,928,081 | 12/1975 | Marley et al. | 148/1.5 |
| 4,018,627 | 4/1977 | Polata | 148/1.5 |
| 4,118,250 | 10/1978 | Horng et al. | 148/1.5 |

*Primary Examiner*—Upendra Roy
*Attorney, Agent, or Firm*—James B. Raden; Marvin M. Chaban

[57] ABSTRACT

The invention relates to an ion-implantation process for fabricating integrated bipolar planar transistors, particularly transistors for very high frequencies. To prevent the variations in the thicknesss of the insulating layer, through which the dopants for the base region are implanted into the semiconductor body in the form of ions, from causing variations in current gain, the dopants for the emitter regions are implanted through the same insulating layer as the dopants for the base region. The total charge in the base region below the emitter region thus becomes substantially independent of thickness variations of the insulating layer through which the dopants for the emitter region and those for the base region are implanted.

3 Claims, 6 Drawing Figures

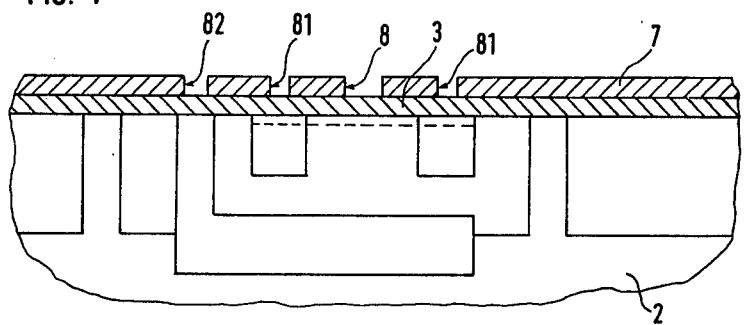
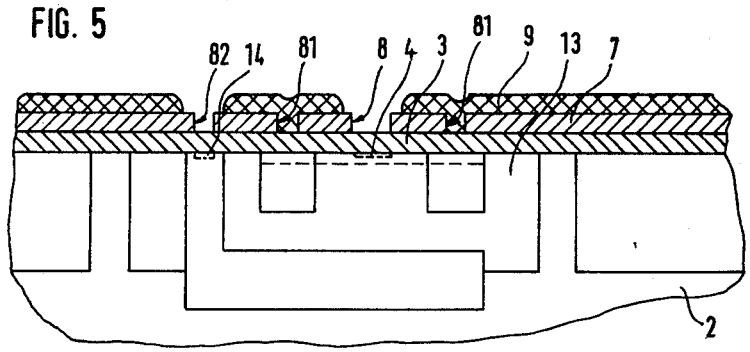
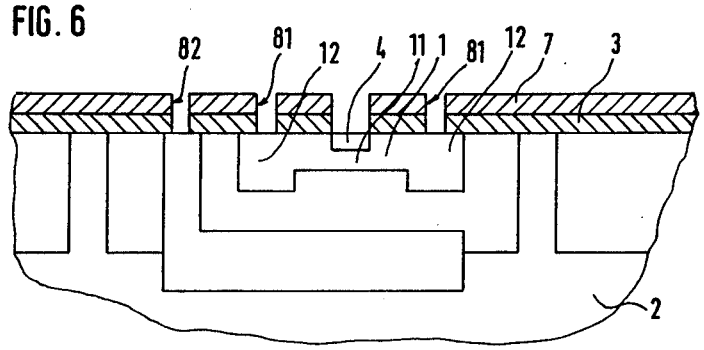

METHOD OF FABRICATING AN INTEGRATED BIPOLAR PLANAR TRANSISTOR BY IMPLANTING BASE AND EMITTER REGIONS THROUGH THE SAME INSULATING LAYER

BACKGROUND OF THE INVENTION

1. Field of the Invention

The present invention relates to a method of fabricating an integrated bipolar planar transistor whose base region is formed by ion implantation through an insulating layer of a given thickness and composition deposited on a semiconductor body, and whose emitter region is also formed by ion implantation.

2. Description of the Prior Art

This type of method is disclosed in European Patent Application No. 0 002 661. In this known method, prior to a final heat treatment between 900° C. and 1,100° C. for annealing lattice imperfections, both the base dopant and the emitter dopant are introduced into the semiconductor surface and activated. Since the initially deposited insulating layer now remains on the semiconductor surface at least in the area of the metallized interconnection pattern, and no reoxidation takes place, lead capacitance variations are relatively small.

However, the known method has a disadvantage in that the base widths and, thus, the current gains of the bipolar planar transistors which are simultaneously fabricated on a semiconductor wafer are subject to variations. These variations correspond to the oxide-thickness variations if the base dopants are not implanted in two implantation processes at different acceleration energies, during which a drift field is produced which retards the movement of the minority carriers, because the base dopant is implanted through an insulating layer made of silicon oxide, while the emitter dopant is introduced directly into the semiconductor surface.

SUMMARY OF THE INVENTION

The object of the invention is to reduce the effect of the variations in the thickness of the insulating layer on the variations in the thickness of the base region under the emitter region without producing a drift field directed towards the emitter region.

This object is attained by implanting the dopants for the emitter region through the same insulating layer as those for the base region.

If arsenic is implanted through an insulating layer made of $SiO_2$, a comparatively very small insulating-layer thickness between 30 and 60 nm must be chosen at an accelerating voltage of 200 kV, the method according to the invention requires that, after the implantation of the base dopant, the thickness of all those portions of the insulating layer through which no implantation of such ions with a relatively great ionic radius takes place should be increased. This is done by depositing an additional insulating layer made of a material which is etchable selectively with respect to the material of the first-mentioned insulating layer, which is preferably made of $SiO_2$, while the material of the additional insulating layer may be $Si_3N_4$. This thickening of the insulating layer eliminates the effects of defects or irregularities on the areas outside the desired pattern of regions in which ions with a relatively great ionic radius are implanted, and reduces the capacitances between the semiconductor body and the interconnection pattern. Sufficiently thin insulating layers can thus be obtained with commercially available implanters.

BRIEF DESCRIPTION OF THE DRAWINGS

FIGS. 1 to 6 are cross-sectional views illustrating the successive process steps of the method of the invention.

DESCRIPTION OF THE INVENTION

Figure 1:
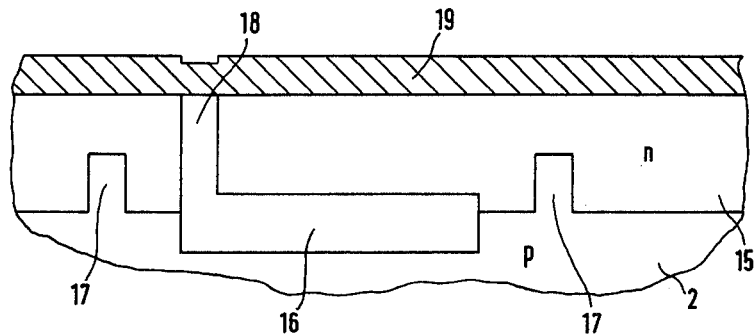

FIG. 1 is a cross section taken approximately perpendicular to a semiconductor wafer, shows part of a monolithic integrated circuit in which an integrated planar transistor according to the invention is to be fabricated.

In a structure as shown in FIG. 1, an n-type epitaxial layer 15 is deposited on a p-type semiconductor body 2 after the n-type dopant of the buried layer 16 and the p-type dopant of the frame-shaped partial insulating region 17 have been introduced into the surface of the semiconductor body 2. To form a low-resistance collector contact to the buried layer 16, the collector contact region 18 is diffused into the surface of the epitaxial layer 15 by a planar diffusion process.

Figure 2:
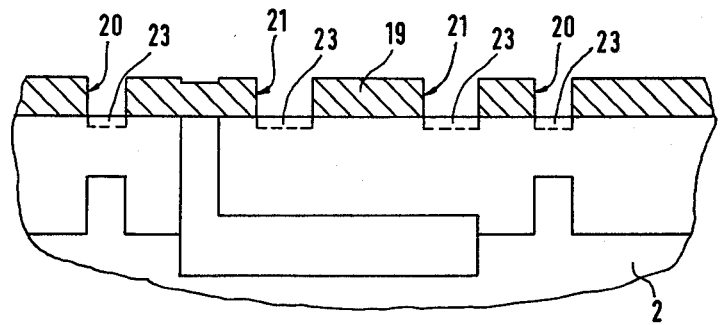

Then, as shown in FIG. 2, the frame-shaped diffusion opening 20 and the stripe-like diffusion opening 21 are formed in the mask layer 19 to permit the diffusion of the insulating region 22 and the base contact region 12, respectively, as shown in FIGS. 3 to 6. By this stripe-like base contact region 12, low-resistance contact to the base 1 and particularly to the active base region 11 and, consequently, a high cutoff frequency are ensured.

Through the openings 20 and 21 shown in FIG. 2, boron is now implanted to form the doped regions 23, from which the insulating region 22 and the base contact region 12 are diffused during a subsequent activation process.

On the exposed semiconductor surface, the insulating layer 3 is then produced, which has an uniform a thickness as possible in the range between 30 and 60 nm.

Figure 3:
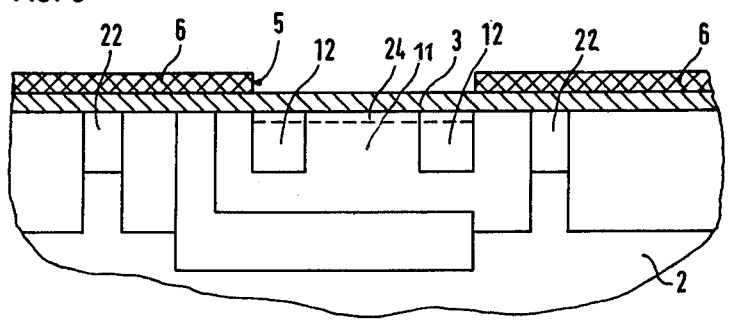

To limit the subsequent implantation of boron, the first photoresist mask layer 6 is deposited as shown in FIG. 3, which has an opening 5 through which boron ions are implanted into the semiconductor surface below this opening to form the doped region 24.

Following the removal of the first photoresist mask layer 6, the insulating layer 3 is covered with an additional insulating layer 7, preferably of $Si_3N_4$, which is etchable selectively with respect to the material of the insulating layer 3, e.g., by means of hot phosphoric acid, which leaves $SiO_2$ virtually unaffected. The additional insulating layer 7 is provided with a window 8 where the emitter region 4 is to be formed, with two base contact windows 81, and with a window 82 where the collector contact region 14 is to be formed. The whole arrangement of FIG. 4 is covered with a second photoresist mask layer 9, which has openings where the emitter region 4 and the collector contact region 14 are to be formed, as shown in FIG. 5. From FIG. 5 it is also apparent that defects in the insulating layer 3 in the form of minute holes are not disturbing because the subsequent implantation of As ions can only take place through these exposed portions of the insulating layer 3.

At a thickness of the insulating layer 3 in the above-mentioned range between 30 and 60 nm, accelerating voltages of about 200 kV are necessary. If phosphorus ions are implanted instead of arsenic ions, an accelerating voltage of 100 kV is sufficient, because the phosphorus ion is smaller than the arsenic ion. However, the preferred dopant for the emitter region is arsenic, because it is better accommodated in the Si lattice, so that better electrical properties of the components are obtained.

Before depositing the insulating layer 3 on the carefully exposed semiconductor body 2, no heat treatment should be carried out, which could activate the ions implanted into the region 23 of FIG. 2. Thus, there is no PN junction yet whose depletion region could attract impurities of dipole nature prior to the deposition of the insulating layer 3.

The thickness of the additional insulating layer 7 must, of course, be chosen so that this layer 7, together with the insulating layer 3, can be used as a mask against the implantation of arsenic ions. The following masking step, i.e., the deposition of the second photoresist mask layer 9, then requires no critical adjustment, because only the base contact window 81 must be covered.

Since the capacitances between the metallized pattern for the emitter region 4, the base contact region 12 and the collector contact region 14 on the one side and the semiconductor body 2 on the other side should be minimized in a UHF planar transistor, it is advantageous to thicken the additional insulating layer 7 by adding a protective-oxide layer of suitable thickness.

Since, with the method according to the invention, the total charge in the base region below the emitter region is independent of oxide-thickness variations, current gains with small ranges of variation can be adjusted independently of the doping of the base region.

This independence of oxide-thickness variation is also the object of the method disclosed in the above-mentioned European Patent Application, which uses two base implantation processes with different energies. However, that method works only as long as a drift field in the base region is tolerated which retards the movement of the minority carriers and degrades the radio-frequency characteristics of the device. The method according to the invention avoids this and still provides "constant" B values, i.e., B values independent of oxide-thickness variations.

What is claimed is:

1. A method of fabricating an integrated bipolar planar transistor whose base region is formed by ion implantation through an insulating layer of a given thickness and composition of a first insulating material deposited on a semiconductor body, and whose emitter region is also formed by ion implantation, wherein the improvement comprises the steps of ion implanting the dopants of a first conductivity type for the emitter region through the same insulating layer as those for the base region forming a first photoresist mask layer having a selected opening; over the insulating layer, implanting ions of a second conductivity type into a portion of the surface of the semiconductor body below said opening, which portion is doped so as to be of the first conductivity type; removing the first photoresist mask layer; depositing an additional insulating layer made of a second material which is etchable selectively with respect to the first material; opening at least one window in the additional insulating layer at least where the emitter region is to be formed; covering the remaining portions of the additional insulating layer with a second photoresist mask layer; implanting ions of the first conductivity type into the semiconductor surface through the exposed portions of the insulating layer; removing the second photoresist mask layer; and activating the implanted ions during a post-diffusion process.

2. A method as claimed in claim 1, wherein boron ions are implanted through the opening in the first photoresist mask layer to form a base region in an n-type surface area of a Si semiconductor body; after deposition of the additional insulating layer, the latter is provided with a first window where the emitter region is to be formed, a second window where a base contact region is to be formed, and a third window where a collector contact region is to be formed; the remaining portions of the additional insulating layer and the second window are covered with the second photoresist mask layer; and arsenic ions are then implanted into the semiconductor surface through the exposed areas of the insulating layer.

3. A method as claimed in claim 2, wherein the insulating layer is formed of $SiO_2$ and the additional insulating layer is formed of $Si_3N_4$.

* * * * *